United States Patent
Jung et al.

(10) Patent No.: US 8,405,454 B2
(45) Date of Patent: Mar. 26, 2013

(54) OUTPUT CIRCUIT OF SEMICONDUCTOR APPARATUS HAVING TWO DIFFERENT TYPES OF DECOUPLING CAPACITORS

(75) Inventors: Boo Ho Jung, Gyeonggi-do (KR); Jun Ho Lee, Gyeonggi-do (KR); Hyun Seok Kim, Gyeonggi-do (KR); Yang Hee Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 8 days.

(21) Appl. No.: 12/843,985

(22) Filed: Jul. 27, 2010

(65) Prior Publication Data

US 2011/0187450 A1 Aug. 4, 2011

(30) Foreign Application Priority Data

Feb. 3, 2010 (KR) ........................ 10-2010-0009911

(51) Int. Cl.
*H01L 25/00* (2006.01)
(52) U.S. Cl. ......... 327/565; 327/551; 327/538; 257/532
(58) Field of Classification Search .................. 327/565, 327/538, 551; 257/532
See application file for complete search history.

(56) References Cited

U.S. PATENT DOCUMENTS

| | | | |
|---|---|---|---|
| 4,737,830 A * | 4/1988 | Patel et al. ..................... 257/296 |
| 4,937,649 A * | 6/1990 | Shiba et al. .................... 257/207 |
| 5,449,948 A * | 9/1995 | Inoue et al. .................... 257/531 |
| 5,513,090 A | 4/1996 | Bhattacharya et al. |
| 5,861,648 A | 1/1999 | Shinozaki |
| 6,465,298 B2 | 10/2002 | Forbes et al. |
| 7,462,912 B2 | 12/2008 | Ahn et al. |
| 7,602,187 B2 | 10/2009 | Luedeke et al. |
| 2003/0034783 A1* | 2/2003 | Thorp et al. .................... 324/519 |
| 2006/0024905 A1 | 2/2006 | He et al. |
| 2006/0138591 A1* | 6/2006 | Amey et al. .................... 257/532 |
| 2006/0289932 A1 | 12/2006 | Ahn et al. |
| 2007/0280025 A1* | 12/2007 | Takahashi et al. ............. 365/226 |
| 2009/0115505 A1* | 5/2009 | Lee et al. ........................ 327/581 |
| 2009/0152664 A1 | 6/2009 | Klem et al. |

FOREIGN PATENT DOCUMENTS

KR 1020090108057 A 10/2009

* cited by examiner

*Primary Examiner* — Ryan Jager
(74) *Attorney, Agent, or Firm* — Ladas & Parry LLP

(57) ABSTRACT

An output circuit of a semiconductor apparatus having two different types of decoupling capacitors is presented. The output circuit includes a first pad, a second pad, a main output unit and a decoupling capacitor region. The first and second pads are configured to respectively provide a power supply voltage and a ground voltage. The main output unit is coupled to the first and second pads. One end of the decoupling capacitor region is coupled to the first pad and the other end is coupled to the second pad. The decoupling capacitor region includes a first decoupling capacitor region spaced apart from a portion of the main output unit by a first distance, and a second decoupling capacitor region spaced apart from the main output unit by a second distance which is greater than the first distance.

11 Claims, 3 Drawing Sheets

OUTPUT CIRCUIT OF SEMICONDUCTOR APPARATUS HAVING TWO DIFFERENT TYPES OF DECOUPLING CAPACITORS

CROSS-REFERENCES TO RELATED APPLICATION

The present application claims priority under 35 U.S.C. §119(a) to Korean application number 10-2010-0009911, filed on Feb. 3, 2010, in the Korean Intellectual Property Office, which is incorporated herein by reference in its entirety as set forth in full.

BACKGROUND

1. Technical Field

The present invention relates to a semiconductor integrated circuit, and more particularly, to an output circuit of a semiconductor apparatus.

2. Related Art

A decoupling capacitor which can maintain a constant voltage and reduce power noise is coupled to an output circuit of a semiconductor apparatus.

In general, since output circuits operate at high frequencies of up to hundreds of MHz or more, then MOS capacitors which exhibit an excellent characteristics in high frequency bands can be used as decoupling capacitors. In the case where an output circuit uses a MOS capacitor as a decoupling capacitor, then a Q-factor of a resonant frequency is likely to increase and power noise is likely to increase in low frequency bands. Hence, data outputted from output circuits that uses MOS capacitors as decoupling capacitors may result being damaged or compromised.

On the other hand, an output circuit that uses an electrolytic capacitor as a decoupling capacitor, instead of a MOS capacitor, is expected to exhibit excellent characteristic in terms of power noise reduction at low frequency bands, but is likely to exhibit increased power noise at high frequency band and thus is prone to electromagnetic interference (EMI).

SUMMARY

An output circuit of a semiconductor apparatus which reduces power noise in all frequency bands is described herein.

In one embodiment of the present invention, an output circuit of a semiconductor apparatus includes: a first pad and a second pad configured to provide a power supply voltage and a ground voltage, respectively; a main output unit configured to be supplied with the power supply voltage and the ground voltage from the first pad and the second pad, respectively; and a decoupling capacitor region, one end of which is coupled to the first pad and the other end of which is coupled to the second pad, wherein the decoupling capacitor region includes a first decoupling capacitor region spaced apart from a portion of the main output unit by a first distance, and a second decoupling capacitor region spaced apart from the main output unit by a second distance which is greater than the first distance.

In another embodiment of the present invention, an output circuit of a semiconductor apparatus includes: a first pad and a second pad configured to provide a power supply voltage and a ground voltage, respectively; a main output unit configured to be supplied with the power supply voltage and the ground voltage from the first pad and the second pad, respectively; and a decoupling capacitor region, one end of which is coupled to the first pad and the other end of which is coupled to the second pad, wherein the decoupling capacitor region includes a first decoupling capacitor region formed to surround edges of the main output unit while maintaining a first distance from the main output unit, and a second decoupling capacitor region spaced apart from the main output unit by a second distance which is greater than the first distance.

In still another embodiment of the present invention, an output circuit of a semiconductor apparatus includes: a first pad and a second pad configured to provide a power supply voltage and a ground voltage, respectively; a main output unit, one end of which is coupled to the first pad and the other end of which is coupled to the second pad; and a decoupling capacitor group, both ends of which are coupled to the main output unit, wherein the decoupling capacitor group includes a first decoupling capacitor coupled to a portion of the main output unit while being spaced apart by a first distance, and a second decoupling capacitor coupled in parallel to the first decoupling capacitor while being spaced apart from the main output unit by a second distance which is greater than the first distance.

BRIEF DESCRIPTION OF THE DRAWINGS

Features, aspects, and embodiments are described in conjunction with the attached drawings, in which.

DETAILED DESCRIPTION

Hereinafter, an output circuit of a semiconductor apparatus according to the present invention will be described below with reference to the accompanying drawings through preferred embodiments.

Figure 1:
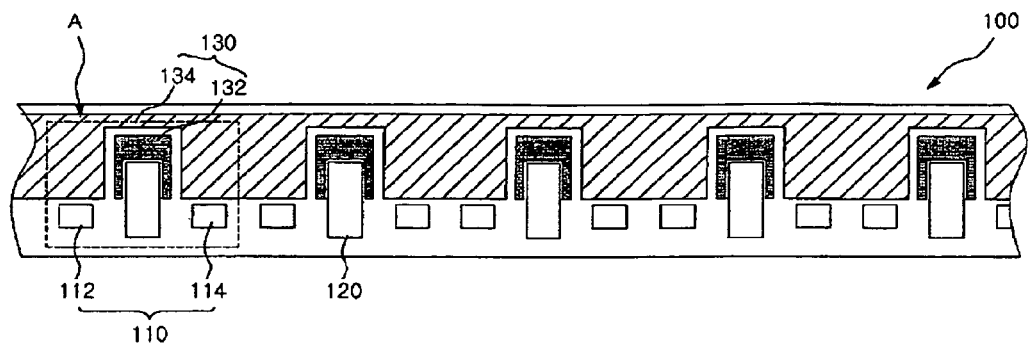
FIG. 1 is a schematic diagram illustrating an output circuit of a semiconductor apparatus according to one embodiment.

FIG. 1 is a schematic diagram illustrating an output circuit of a semiconductor apparatus according to one embodiment. The output circuit 100 of the semiconductor apparatus according to one embodiment includes a voltage supply pad 110, a main output unit 120, and a decoupling capacitor region 130.

The voltage supply pad 110 is provided with a plurality of pads which are arranged in a row in the output circuit 100 of the semiconductor apparatus.

The voltage supply pad 110 is configured to provide a pair of a power supply voltage VDD and a ground voltage VSS to the single main output unit 120. More specifically, the voltage supply pad 110 includes a pair of pads, that is, a first pad 112 configured to provide the power supply voltage VDD to the main output unit 120 and a second pad 114 configured to provide the ground voltage VSS to the main output unit 120. The first pad 112 and the second pad 114 according to one embodiment will be described later in detail with reference to FIG. 2.

The main output unit 120 is provided with a plurality of output units A and is configured to output data to the outside.

The main output unit 120 is disposed between the first pad 112 and the second pad 114 in order to receive the pair of the power supply voltage VDD and the ground voltage VSS from the voltage supply pad 110. The main output unit 120 according to one embodiment will be described later in detail with reference to FIG. 3.

The decoupling capacitor region 130 is a region in which decoupling capacitors having different characteristics are densely arranged in order to maintain an input voltage of the main output unit 120 at a substantially constant level and reduce power noise in all frequency bands (that is, a high frequency band and a low frequency band).

The decoupling capacitor region 130 includes a first decoupling capacitor region 132 and a second decoupling region 134. The first decoupling capacitor region 132 is disposed in a portion of the main output unit 120 and can reduce power noise in a high frequency band. The second decoupling region 134 which is disposed in a portion spaced further away from the main output unit 120 than the first decoupling capacitor region 132, that is, in a portion of the voltage supply pad 110. The second decoupling region 134 can reduce power noise in a low frequency band.

The first decoupling capacitor region 132 and the second decoupling capacitor region 134 are repetitively disposed corresponding to the configuration of the main output unit 120 and the voltage supply pad 110 which are also repetitively disposed. The first decoupling capacitor region 132 and the second decoupling capacitor region 134 will be described below in detail with reference to FIG. 2.

Figure 2:
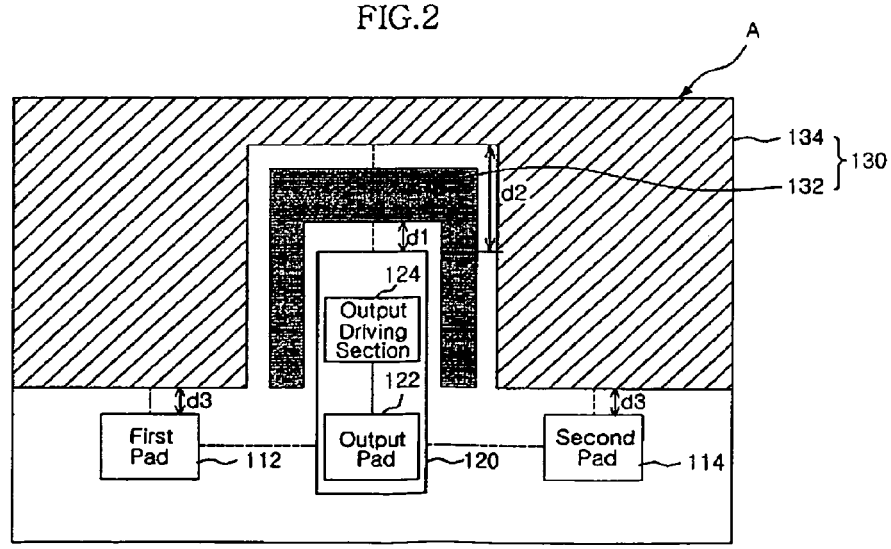
FIG. 2 is a enlarged diagram illustrating a portion A in the output circuit of the semiconductor apparatus of FIG. 1.

FIG. 2 is a enlarged diagram illustrating a portion A in the output circuit of the semiconductor apparatus of FIG. 1 according to one embodiment. The output circuit of the semiconductor apparatus according to one embodiment includes the first pad 112, the second pad 114, the main output unit 120, and the decoupling capacitor region 130.

Although not illustrated in detail, the first pad 112 is a power supply voltage pad which is coupled to one end of the main output unit 120 and coupled to one end of the decoupling capacitor region 130 in order to supply the power supply voltage VDD.

Although not illustrated in detail, the second pad 114 is a ground voltage pad which is coupled to the other end of the main output unit 120 and coupled to the other end of the decoupling capacitor region 130 in order to supply the ground voltage VSS.

In this embodiment, the first pad 112 and the second pad 114 are designed as the power supply voltage pad and the ground voltage pad, respectively, but the invention is not limited thereto. That is, the first pad 112 and the second pad 114 may be designed as the ground voltage pad and the power supply voltage pad, respectively.

The main output unit 120 includes an output driving section 124 and an output pad 122 configured to transmit the output signal of the output driving section 124 to the outside.

The main output unit 120 is disposed between the first pad 112 and the second pad 114. One end of the main output unit 120 is coupled to the first pad 112, and the other end of the main output unit 120 is coupled of the second pad 114.

The decoupling capacitor region 130 includes the first decoupling capacitor region 132 and the second decoupling region 134 as illustrated in FIG. 1.

The first decoupling capacitor region 132 is spaced apart from a portion of the main output unit 120 by a first distance d1, and functions to reduce power noise generated in a high frequency band.

The first decoupling capacitor region 132 may use a plurality of MOS capacitors which can reduce power noise in a high frequency band because they have a low resistance. In general, the MOS capacitor is formed such that a source and a drain, which are active regions, face each other, with a gate interposed therebetween, on a silicon substrate which is a semiconductor substrate.

The arrangement of the MOS capacitor in the first decoupling capacitor region 132 is to realize the benefits of a MOS capacitor that exhibits excellent high frequency characteristics because the main output unit 120 usually operates at a high frequency.

The second decoupling capacitor region 134 is disposed closer to the first pad 112 and the second pad 114 by a third distance d3 than the main output unit 120 a second distance d2. The second decoupling capacitor region 134 is spaced apart from the main output unit 120 by the second distance d2. The second decoupling capacitor region 134 may preferably use an electrolytic capacitor that exhibits having an excellent characteristic in a low frequency band. In general, the electrolytic capacitor is formed such that an insulation layer is inserted between a positive electrode and a negative electrode that face each other.

Since the first pad 112 and the second pad 114 are usually driven in a low frequency band, the second decoupling capacitor region 134 is formed close to the first pad 112 and the second pad 114 so that power noise can be reduced in a low frequency band.

In order to optimize the resonant frequency, the number of the MOS capacitors disposed in the first decoupling capacitor region 132 may be larger than the number of the electrolytic capacitors disposed in the second decoupling capacitor region 134.

Furthermore, a larger number of MOS capacitors may be disposed in parallel in the first decoupling capacitor region 132. This is because when a larger number of MOS capacitors are coupled in parallel, a parallel effect is maximized and thus resistance can be reduced and impedance can be reduced. In order to apply a larger number of MOS capacitors, a size of a MOS capacitor, that is, a gate channel length of a MOS capacitor may be 1 um to 2 um.

Since the output circuit of the semiconductor apparatus according to one embodiment has the decoupling capacitor region 130 including the first and second decoupling regions 132 and 134 in which different types of capacitors are disposed, power noise can be reduced in all frequency bands (the high frequency band and the high frequency band) and signal distortion and EMI can be reduced.

Although a configuration which determines an operating frequency band of the output circuit is not described herein, a switch (not shown) which determines a frequency band may be additionally provided, or a configuration which determines a frequency band may be provided within the circuit itself.

Figure 3:
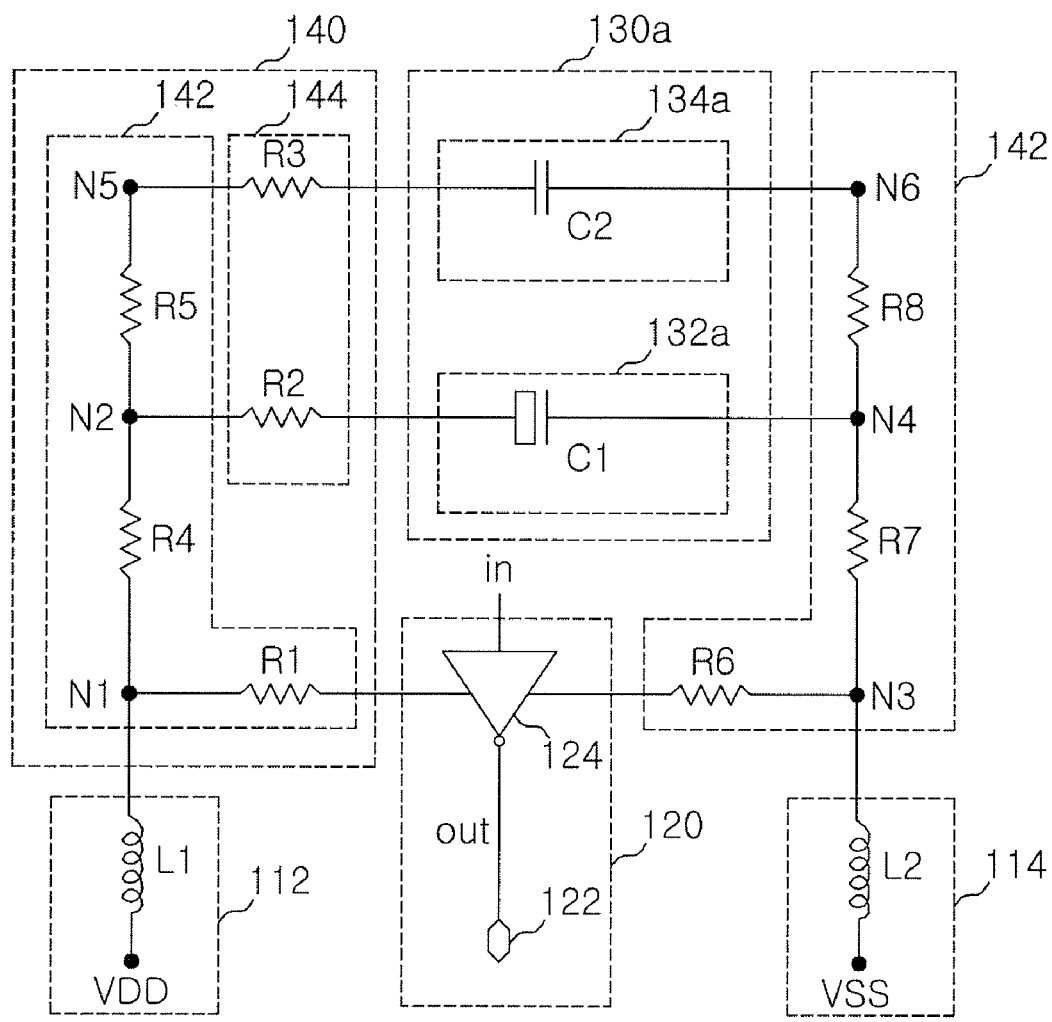
FIG. 3 is a circuit diagram illustrating the portion A in the output circuit of the semiconductor apparatus of FIG. 2.

FIG. 3 is a circuit diagram illustrating one embodiment of an output circuit of the semiconductor apparatus of FIG. 2. The output circuit of the semiconductor apparatus according to one embodiment includes the first and second pads 112 and 114, the main output unit 120, and a decoupling capacitor group 130a.

The detailed configuration and principal operation of the portion of the output circuit of the semiconductor apparatus will be described below.

The first pad 112 is a power supply voltage pad which supplies the power supply voltage VDD through a power supply line L1 to the main output unit 120, and is electrically coupled to one end of the main output unit 120 and one end of the decoupling capacitor group 130a.

The second pad 114 is a ground voltage pad which supplies the ground voltage VSS through a power supply line L2 to the main output unit 120, and is electrically coupled to the other end of the main output unit 120 and the other end of the decoupling capacitor group 130a.

The main output unit 120 receives data through an input node in coupled to an upper end of an output driving section 124, and transmits the received data to an output pad 122 through an output node out coupled to a lower end of the output driving section 124.

Also, a left end of the output driving section 124 is electrically coupled to the first pad 112 through a node N1, and a right end of the output driving section 124 is electrically coupled to the second pad 114 through a node N3.

The decoupling capacitor group 130a includes a first decoupling capacitor 'C' 132a disposed in the first decoupling capacitor region 132 illustrated in FIG. 2, and a second decoupling capacitor 'C2' 134a disposed in the second decoupling capacitor region 134 illustrated in FIG. 2.

In this case, as described above, the first decoupling capacitor 132a may be a MOS capacitor C1, and the second decoupling capacitor 134a may be an electrolytic capacitor C2.

In order to maintain a substantially constant voltage and reduce power noise generated in a high frequency band, both ends of the first decoupling capacitor 132a are coupled through nodes N2 and N4 to both ends of the main output unit 120 and the first and second pads 112 and 114, respectively.

At this time, since the main output unit 120 usually operates in a high frequency band, the first decoupling capacitor 132a is disposed closer to the main output unit 120 than the second decoupling capacitor 134a.

The second decoupling capacitor 134a is coupled in parallel to the first decoupling capacitor 132a through the nodes N2, N4, N5 and N6.

Furthermore, in order to maintain a substantially constant voltage and reduce power noise generated in a low frequency band, the second decoupling capacitor 134a is coupled the first and second pads 112 and 114 disposed at the ends of the main output unit 120.

Although the output circuit of the semiconductor apparatus to which the single first decoupling capacitor 132a and the single second decoupling capacitor 134a are applied has been described above as one example, the first decoupling capacitors 132a may be disposed more than the second decoupling capacitors 134a in order to optimize the resonant frequency.

In addition, the channel length of the first decoupling capacitor 132a may be formed smaller than the channel length of the second decoupling capacitor 134a in order to maximize the parallel effect and reduce the resistance. The channel length of the first decoupling capacitor 132a may be 1 um to 2 um. That is it is preferable that a channel length of MOS capacitor, i.e., the first decoupling capacitor 132a, is smaller than a width of an insulation layer between opposing electrodes of the electrolytic capacitor, i.e., the second decoupling capacitor 134a.

The output circuit of the semiconductor apparatus according to one embodiment may further include a resistor unit 140. The resistor unit 140 is a type of an interconnection resistor, and may include interconnection resistors 142 from the first and second pads 142 and 114 to the main output unit 120, and a resistor 144 from the first and second decoupling capacitors 132a and 134a to the interconnection.

Figure 4:
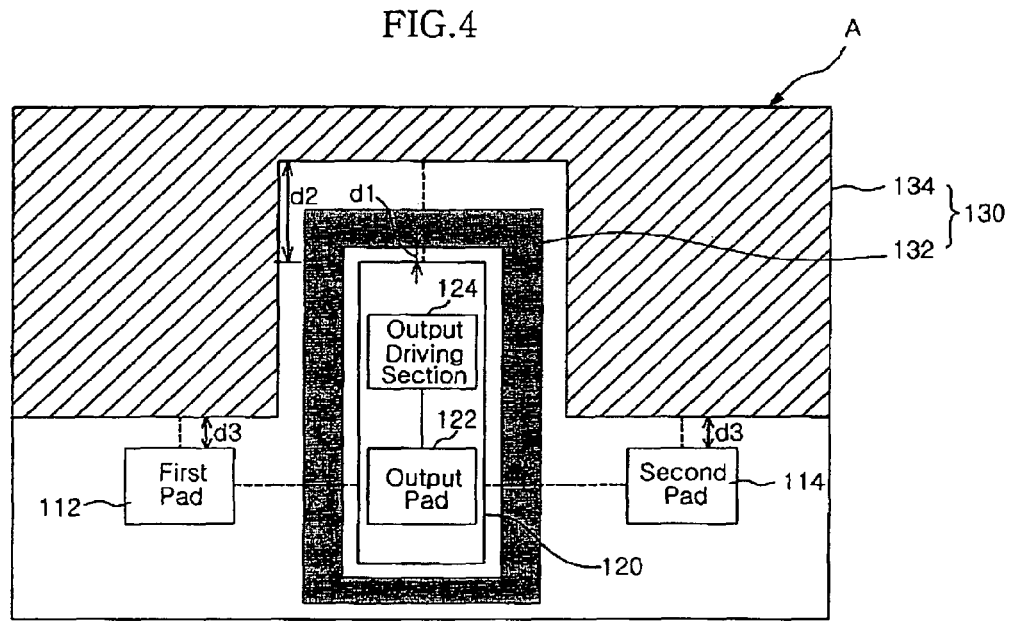
FIG. 4 is a schematic diagram illustrating an output circuit of a semiconductor apparatus according to another embodiment of the present invention.

FIG. 4 is a schematic diagram illustrating an output circuit of a semiconductor apparatus according to another embodiment. Since first and second pads 112 and 114, a main output unit 120, and a second decoupling capacitor region 134 in the output circuit of the semiconductor apparatus according to another embodiment have the substantially same configurations as those of the foregoing embodiment, a detailed description thereof will be omitted and only a first decoupling capacitor region 132 will be described below.

The first decoupling capacitor region 132 may be formed to surround the edges of the main output unit 120 while maintaining a distance d1 from the main output unit 120.

The reason why the first decoupling capacitor region 132 is formed to surround the edges of the main output unit 120 is because the main output unit 120 usually operates in a high frequency band, and thus, impedance can be reduced and power noise can also be reduced by disposing a larger number of decoupling capacitors.

A MOS capacitor having an excellent characteristic in a high frequency band may be applied to the first decoupling capacitor region 132.

Since the output circuit of the semiconductor apparatus according to this embodiment has the first capacitor region and the second capacitor region in which different types of capacitors are disposed, power noise can be reduced in all frequency bands (the low frequency band and the high frequency band) and signal distortion and EMI can be reduced.

While certain embodiments have been described above, it will be understood to those skilled in the art that the embodiments described are by way of example only. Accordingly, the output circuit of the semiconductor apparatus described herein should not be limited based on the described embodiments. Rather, the output circuit of the semiconductor apparatus described herein should only be limited in light of the claims that follow when taken in conjunction with the above description and accompanying drawings.

What is claimed is:

1. An output circuit of semiconductor apparatus, comprising:
   a first pad and a second pad configured to provide a power supply voltage and a ground voltage, respectively;
   a main output unit configured to be supplied with the power supply voltage and the ground voltage from the first pad and the second pad, respectively; and
   a decoupling capacitor region, one end of the decoupling capacitor region is coupled to the first pad and another end of the decoupling capacitor region is coupled to the second pad,
   wherein the decoupling capacitor region comprises:
   a first decoupling capacitor region spaced away from a portion of the main output unit at a first distance; and
   a second decoupling capacitor region spaced away from the main output unit at a second distance such that the second distance is greater than the first distance,
   wherein one or more MOS capacitors are disposed in the first decoupling capacitor region,
   and one or more electrolytic capacitors are disposed in the second decoupling capacitor region.

2. The output circuit according to claim 1, wherein a number of the one or more MOS capacitors is larger than a number of the one or more electrolytic capacitors.

3. The output circuit according to claim 1, wherein a channel length of the one or more MOS capacitors is smaller than a width of an insulation layer between opposing electrodes of the one or more electrolytic capacitors.

4. The output circuit according to claim 3, wherein the channel length of the one or more MOS capacitors is between about 1 um to 2 um.

5. The output circuit according to claim 1, wherein the second decoupling capacitor region is disposed closer to the first and second pads than the main output unit.

6. The output circuit according to claim 5, wherein the first decoupling capacitor region and the second decoupling capacitor region are coupled in parallel.

7. An output circuit of semiconductor apparatus, comprising:
- a first pad and a second pad configured to provide a power supply voltage and a ground voltage, respectively;
- a main output unit configured to be supplied with the power supply voltage and the ground voltage from the first pad and the second pad, respectively; and
- a decoupling capacitor region, one end of the decoupling capacitor region is coupled to the first pad and another end of the decoupling capacitor region is coupled to the second pad,
- wherein the decoupling capacitor region comprises:
- a first decoupling capacitor region spaced away from a portion of the main output unit at a first distance; and
- a second decoupling capacitor region spaced away from the main output unit at a second distance such that the second distance is greater than the first distance,
- wherein one or more MOS capacitors are disposed in the first decoupling capacitor region,
- and one or more electrolytic capacitors are disposed in the second decoupling capacitor region.

8. The output circuit according to claim 7, wherein the second decoupling capacitor region is closer to the first and second pads than the main output unit.

9. The output circuit according to claim 8, wherein the first decoupling capacitor region and the second decoupling capacitor region are coupled in parallel.

10. An output circuit of semiconductor apparatus, comprising:
- a first pad and a second pad configured to provide a power supply voltage and a ground voltage, respectively;
- a main output unit, one end of the main output unit being coupled to the first pad and another end of the main output unit being coupled to the second pad; and
- a decoupling capacitor group having both opposing ends coupled to the main output unit,
- wherein the decoupling capacitor croup comprises:
- a first decoupling capacitor coupled to a portion of the main output unit and spaced apart from the main output unit by a first distance; and
- a second decoupling capacitor coupled in parallel to the first decoupling capacitor and spaced apart from the main output unit by a second distance such that the second distance is greater than the first distance,
- wherein the first decoupling capacitor comprises a MOS capacitor,
- and the second decoupling capacitor comprises an electrolytic capacitor.

11. The output circuit according to claim 10, wherein the second decoupling capacitor region is closer to the first and second pads than the main output unit.

* * * * *